United States Patent [19]

Kleuters et al.

[11] 4,193,091
[45] Mar. 11, 1980

[54] OPTICAL VIDEODISC READ UNIT WITH TRACKING AND FOCUSSING WOBBLERS

[75] Inventors: Wilhelm J. Kleuters; Gerard E. Van Rosmalen; Martinus P. M. Bierhoff; Kornelis A. Immink, all of Eindhoven, Netherlands

[73] Assignee: U.S. Philips Corporation, New York, N.Y.

[21] Appl. No.: 905,890

[22] Filed: May 15, 1978

[30] Foreign Application Priority Data

Dec. 12, 1977 [NL] Netherlands .......................... 7713711

[51] Int. Cl.² ............................ G11B 7/12; G11B 7/08
[52] U.S. Cl. ........................... 358/128.5; 179/100.3 Z; 179/100.41 P
[58] Field of Search ............... 358/128; 179/100.3 V, 179/100.3 Z, 100.41 P; 250/201, 370

[56] References Cited

U.S. PATENT DOCUMENTS

| | | | |
|---|---|---|---|
| 3,349,174 | 10/1967 | Warschauer | 179/100.3 Z |
| 4,005,259 | 1/1977 | Kaneko | 358/128 |
| 4,032,776 | 6/1977 | Rosmalen | 358/128 X |
| 4,092,529 | 5/1978 | Aihara et al. | 358/128 X |

*Primary Examiner*—Bernard Konick
*Assistant Examiner*—Donald McElheny, Jr.
*Attorney, Agent, or Firm*—Thomas A. Briody; William J. Streeter; Simon L. Cohen

[57] ABSTRACT

An optical read unit for reading radiation-reflecting video discs comprises a semiconductor laser which with the aid of a scan wobbler and a focussing wobbler is moved at high frequency in two directions relative to the video disc, a radial direction for tracking purposes and a direction normal to the disc for the purpose of automatic focussing. The semiconductor diode laser is mounted on a metal radiation source carrier which is connected to a heat sink for carrying off the heat with a low temperature gradient, and is driven by piezo-electric plates.

9 Claims, 10 Drawing Figures

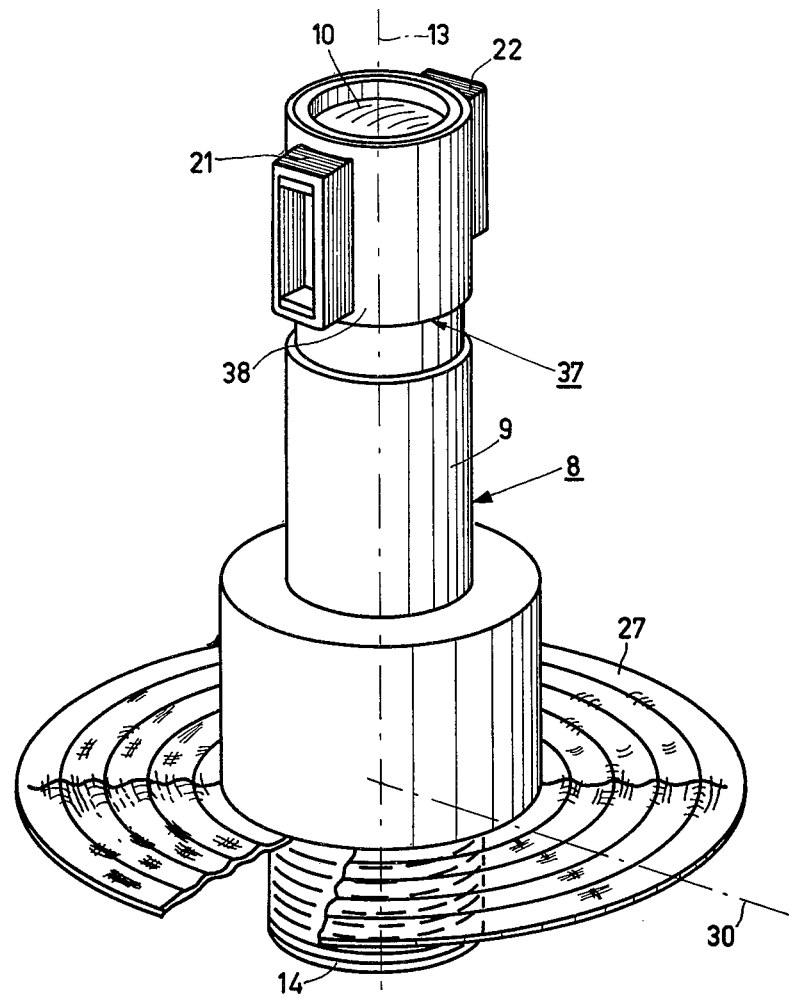
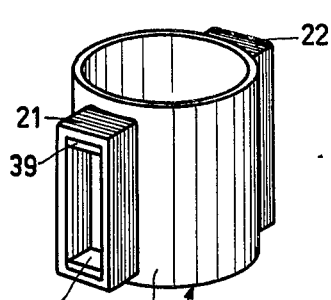
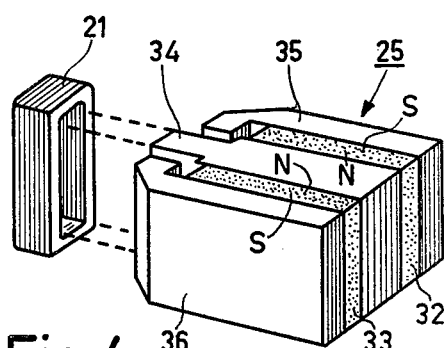

OPTICAL VIDEODISC READ UNIT WITH TRACKING AND FOCUSSING WOBBLERS

SUMMARY OF THE INVENTION

The invention relates to an optical read unit for optically reading radiation-reflecting information tracks disposed in an information plane of an information carrier, which moves relative to the read unit, with the aid of a radiation beam which is focussed to a read spot in a focussing plane, and more in particular for optically reading a rotating video disc with the aid of a laser beam, which unit comprises: a low-mass radiation source, such as a semiconductor diode laser, for producing the radiation beam; a lens system for focussing the radiation beam to a read spot in the focussing plane; optical and electronic means for receiving a radiation beam which has been reflected by the information tracks and modulated by the information in the information tracks and comprising a radiation-sensitive electronic detector for the conversion of the radiation beam modulation into an electrical modulation; a scan wobbler for an automatic tracking system and comprising electromechanical drive means for periodically moving the radiation source so as to cause the read spot in the focussing plane to move periodically about a global position with low amplitude (scan wobble) in a direction transverse to the information track being read and a focussing wobbler for an automatic focussing system and comprising electromechanical drive means for periodically moving the radiation source so as to cause the focussing plane to move periodically about a global position with low amplitude (focussing wobble) in a direction normal to the information plane at the location of the read spot; and an electrical power supply circuit for supplying supply voltage to the electromechanical drive means.

The Applicants previously filed Patent Application, which has not yet been laid open for public inspection, namely Netherlands Patent Application NL-PA 76 08561 corresponding to U.S. Pat. application Ser. No. 924,858, filed July 17, 1978, describes an optical read unit of the type mentioned in the preamble. As a radiation source a semiconductor diode laser is used. The radiation beam which has been modulated by the information in the information tracks is returned to the semiconductor diode laser by the lens system, the diode laser itself acting as radiation-sensitive electronic detector for the conversion of the radiation beam modulation into an electrical modulation, in that certain properties of the diode laser vary in dependence on the radiation beam modulation. Specifically, the quotient of the voltage across and the current through the diode laser varies at a specific current, or briefly the electrical resistance of the diode laser varies in step with the reflected modulated beam.

The Applicant has already proposed various methods of detecting positional errors of the read spot relative to an information track to be read, see for example the previous Netherlands Patent Application NL-PA 72 06378 corresponding to U.S. Pat. No. 3,876,842, and NL-PA 73 05517. The positional errors of the read spot may be deviations from the correct position of the read spot which are disposed in the information plane, so-called tracking errors, or deviations in the position of the focussing plane relative to the information plane, so-called focussing errors. The previously mentioned Netherlands Patent Application NL-PA 76 08561 also contains a proposal for a method of detecting positional errors. In accordance with this proposal the radiation source is periodically moved by a scan wobbler and/or a focussing wobbler with the aid of electro mechanical means, so that a periodic displacement of the read spot relative to its global position is obtained, the displacement having an amplitude which is smaller than the diameter of the read spot and having a frequency which is substantially lower than the frequency which corresponds to the average spacial frequency of the details in the information tracks. The automatic tracking system, or as the case may be the automatic focussing system, comprises an electronic circuit for processing the signal supplied by the semiconductor diode laser, the circuit including a filter for extracting a low frequency signal which is processed into a control signal which is applied to electro-magnetic means for correcting the position of the read spot relative to the information track to be read. For example, in accordance with an other Netherlands Patent Application NL-PA 77 03232, corresponding to U.S. Patent application Ser. No. 911,212, filed June 1, 1978, previously filed by the Applicant and not yet laid open for public inspection, it is possible under the influence of the control signals to tilt the entire optical read unit about an axis parallel to the information plane and normal to the axis of rotation of a video disc for the purpose of tracking, while for focussing the read unit can bodily be moved to and fro in the direction of its optical axis.

It is the object of the invention to provide an optical read unit of the type mentioned in the preamble in which the electro-mechanical drive means for periodically moving the radiation source has small dimensions and has a satisfactory efficiency and which furthermore assures a satisfactory removal of heat from the radiation source. In accordance with the invention a read unit of the type mentioned in the preamble is therefore characterized in that at least one of the wobblers comprises: a metal resilient rod-shaped radiation source carrier with an end secured to the radiation source in a satisfactorily heat-conducting manner; a metal heat sink whose heat capacity and surface area are several times greater than those of the radiation source and to which the radiation source carrier is connected at some distance from the radiation source in a satisfactorily heat-conducting manner, so as to carry off heat, produced at the location of the radiation source, with a low temperature gradient to locations where it can be released to the environment over a sufficiently large surface area and piezo-electric drive means rigidly connected to the said radiation-source carrier and to parts of the read unit which are stationary relative thereto.

In the read unit in accordance with the invention the wobblers make use of mechanical resonance with the aid of the metal resilient rod-shaped radiation-source carrier. As a result of this a relatively low drive power suffices and moreover excellent heat removal is possible via the metal rod-shaped carrier. Suitably, an embodiment of the invention may be employed which is characterized in that the resilient rod-shaped radiation-source carrier is integral with a metal mount and consists of a portion of the mount which is separated from the remaining portion by means of at least one slot. This embodiment prevents an undesired heat resistance at the location where the rod-shaped carrier is secured.

The use of an optical read unit which is provided with both a scan wobbler and a focussing wobbler is readilly possible, namely when a read unit in accordance with the invention is characterized in that the piezo-electric drive means comprises drive means for the scan wobble disposed in a first direction and drive means for the focussing wobble disposed in a second direction perpendicular to the first direction. In such an embodiment the resilient metal rod-shaped radiation source carrier performs vibrations in two directions which are perpendicular to each other. This is found to work very well in practice.

In order to achieve optimum efficiency, in accordance with a further embodiment of the invention, the electrical power supply circuit for the piezo-electric drive means for each wobbler is preferably included in a self-oscillating loop which includes the piezo-electric drive means for periodically moving the radiation source with a frequency corresponding to the resonant frequency of the resilient rod-shaped radiation source carrier in the relevant direction of movement. It is then possible to cause the radiation source carrier to perform two vibrations of different frequency and amplitude by giving the radiation source carrier in the one direction of vibration a different rigidity than in the other direction of vibration.

As the piezo-electric drive means themselves also have a certain rigidity, which is certainly not negligible, these drive means influence the vibration and the vibration mode of the radiation source carrier. In a further embodiment of the invention the influence of the piezo-electric drive means on the movements of the radiation source carrier is minimized. This embodiment is characterized in that the metal resilient rod-shaped radiation source carrier consists of a rod spring with a free end and, disposed opposite thereto, a fixed end, the radiation source being secured to the free end and the fixed end being connected to the heat sink, and that the piezo-electric drive means is connected to the rod spring at such a location between the free end and the fixed end, that the ratio between the amplitude (s) of the periodic movements of the radiation source and the amplitude(s) of the supply voltage(s) applied to the piezo-electric drive means substantially has a maximum value.

A still further embodiment of the invention gives the advantage that a satisfactory shielding is possible of the semiconductor diode laser against electromagnetic fields which are produced by the piezo-electric drive means, without adversely affecting the efficiency of the drive means. This embodiment is characterized in that the metal resilient rod-shaped radiation source carrier consists of a rod spring having a first free end on which the radiation source is mounted and a second free end which is disposed opposite the first free end; that between the two free ends the radiation source carrier is rigidly connected to the heat sink at a connection point; and that the piezo-electric drive means is connected to the rod spring near the second free end. The connection point between the rod spring and the heat sink in this embodiment then functions as a pivot for the movement of the radiation source carrier, the movements at the location of the pivot having a substantially negligible amplitude, so that a shielding envelope for the piezo-electric drive means may contact the rod spring at this location without having a significant influence on the movements thereof. Thus, the piezo-electric means may be encapsulated almost completely so as to prevent the occurrence of electro-magnetic interference.

An optical read unit in accordance with the last-mentioned embodiment may advantageously be modified so as to be characterized in that the piezo-electric drive means of the scan wobbler and the drive means of the focussing wobbler are combined to single drive means which exert driving forces on the radiation source carrier in a direction which is disposed between the directions of the radiation-source movements necessary for the scan wobble and the focussing wobble respectively. This embodiment enables two wobble modes to be produced with the aid of a single piezo-electric drive element, namely the scan wobble and the focussing wobble.

BRIEF DESCRIPTION OF THE DRAWING

The invention will now be described in more detail with reference to the drawing, which schematically shows an embodiment and in which:

FIG. 2 shows a perspective view of a part of the read unit of FIG. 1, comprising an objective, a bearing diaphragm for the objective, and electro-magnetic control means, FIG. 3 in perspective shows a coil mount of the read unit of FIG. 1 with four coils for the electrical control of tracking movements, FIG. 4 in perspective illustrates the cooperation between one of the coils of FIG. 3 and an associated permanent-magnetic stator.

DETAILED DESCRIPTION OF THE PREFERRED EMBODIMENT

Figure 1:
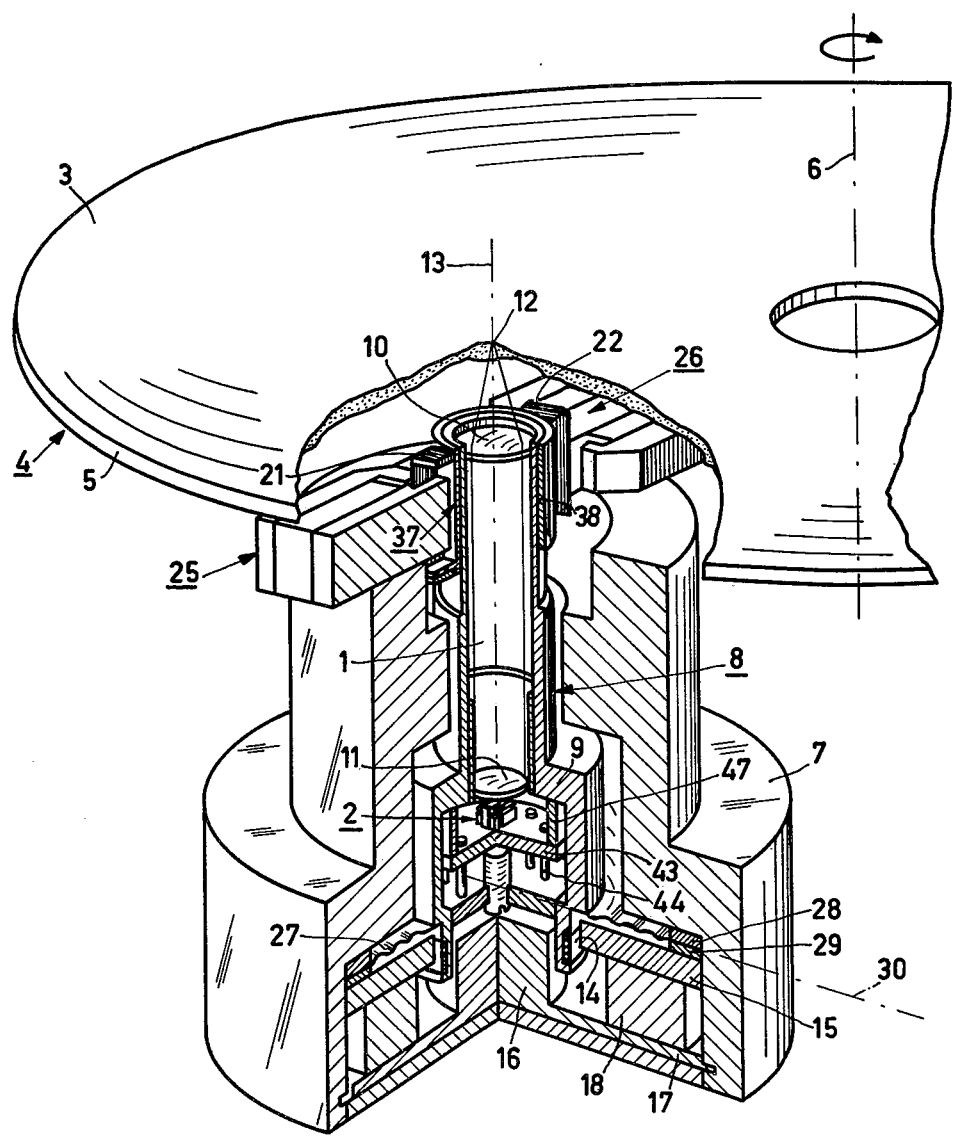
FIG. 1 in perspective and partly in cross-section shows an optical read unit, which is suitable for bodily performing movements for focussing and tracking.
Figure 5:
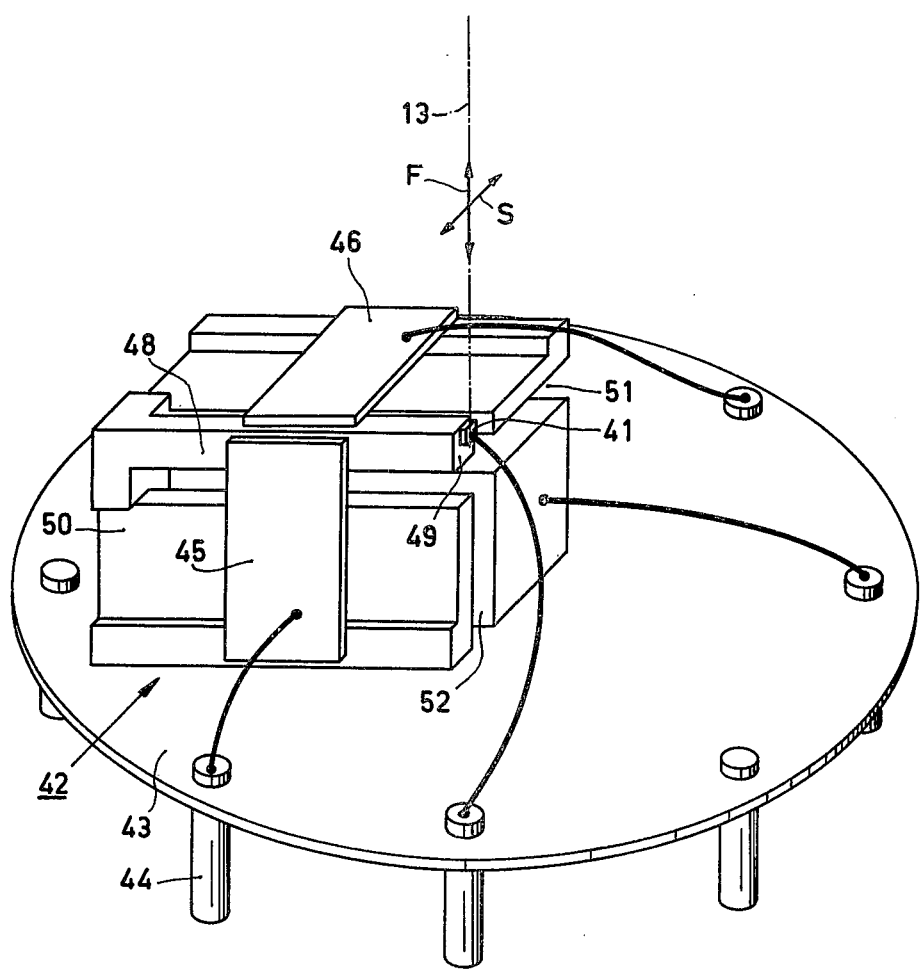
FIG. 5 shows an example of a combined scan and focussing wobbler for the read unit of FIG. 1.

FIG. 1 shows an optical read unit in accordance with the previously cited Patent Application NL-PA 77 03232 which is adapted to scan information tracks in an information plane 3 of a rotating video disc 4 with the aid of a radiation beam 1, obtained from a unit 2 in accordance with FIG. 5, which is represented only symbolically, and which comprises a diode laser and a combined scan and focussing wobbler. The structure of the video disc will not be discussed in further detail, for this reference is made to series of articles published in "Philips Technical Review", Vol. 33, 1973, No. 7, pages 178–193. The video disc is rotatable about an axis of rotation 6. This is symbolically indicated by means of a curved arrow. The means which serve for rotating the video disc are irrelevant for the invention and are not shown in the drawing.

The optical read unit comprises a frame 7 which is made of a non-magnetizable material such as a suitable plastic or aluminium. A recess in the frame accommodates an objective 8, comprising a tube 9 and a lens system which is symbolically represented by two lenses 10 and 11. A description of a a combination of means in the tube 9, which ensures that the radiation beam is generated, is focussed to a read spot of the desired dimension on the recording surface so that the modulation of the reflected beam is converted into an electrical signal falls beyond the scope of the present description. For a description of a combination of means suitable for the present read unit reference is made to the said Patent Application Nl-PA 76 08561 (which is incorporated herein by reference). In this respect "objective" is to be understood to mean the lens system as well as the combination of parts which are rigidly connected thereto and which are movable relative to the chassis 7. By means of the lens system the radiation beam 1 can be concentrated to a scanning spot 12 in a focussing plane. The optical axis of the lens system is designated by the reference numeral 13.

Near the bottom of the objective 8 an annular focusing coil 14, which is wound from electrically conducting wire, is secured to the tube 9. This coil belongs to electrically controllable focusing means for electrically performing and controlling focussing movement parallel to the optical axis 13 of the objective. The focussing coil 14 is disposed in an air gap between a soft-iron plate 15 and a soft-iron core 16 belonging to a permanent-magnetic stator. Between the soft-iron plate 15 and a soft-iron flange 17 which is connected to the soft-iron core 16 there is disposed an axially magnetized permanent-magnetic stator magnet 18. By applying a control signal to the focussing coil 14 by means, not shown, which are irrelevant for the present invention, an electro-magnetic Lorenz force is exerted on the focussing coil and thus on the tube, which force is directed in accordance with the optical axis 13 of the objective.

Near the top of the objective there are disposed two coils 21 and 22, wound from an electrically conducting material, which coils cooperate with two permanent magnetic stators 25 and 26. These coils and stators belong to the electrically controllable means for electrically performing and controlling tracking movements of the objective 8. These means will be discussed in more detail further in the description.

For the focussing movements and for the tracking movements there is provided a combination of a focussing bearing and a tracking bearing, comprising a single resilient objective suspension 8 near the bottom and made of an impregnated, undulated textile fiber diaphragm 27. This diaphragm is rigidly connected to the tube 9 by glueing and is also rigidly connected to the frame 7 with the aid of two rings 28 and 29 and by glueing.

With the aid of electrically controllable tracking means the objective can be tilted about a tilting axis 30 which is substantially normal to the optical axis 13. The deformability of the diaphragm 27 allows the various movements to be performed.

The tracking coils 21 and 22, which are connected to the objective near the top, are wound from electrically conducting wire, with turns which are situated in planes substantially parallel to the optical axis 13 of the lens system and which have an oblong shape. The longitudinal direction of the tracking coils is parallel to the optical axis. The tracking stators 25 and 26 cooperate with the tracking coils. The tracking coils are located in an air gap of the associated permanent-magnetic stator. Owing to the oblong shape of the coils there is sufficient room for performing the focussing movements.

FIG. 4 shows a stator 25 with the cooperating coil 21. The stator 25 comprises two permanent magnets 32 and 33. Their direction of magnetization is indicated by means of double arrows and the letters N and S, the letter N denoting the north pole and the letter S the south pole. Between the magnetic 32 and 33 a soft-iron core 34 is glued. Furthermore, on both sides of the assembly consisting of the core 34 and the permanent magnets 32 and 33, there are disposed two soft-iron pole shoes 35 and 36. Between the ends of the core 34 and the pole shoes 35 and 36 a substantially homogeneous magnetic field exists whose lines of force are parallel to the direction of magnetization of the permanent magnets 32 and 33 and are normal to the parts of the turns of the coil 19 disposed in the air gap between the core 34 and the pole shoes 35 and 36. The height dimension of the core 34 is smaller than the corresponding length dimension of the coil 19. As a result of this it is possible that the coil 21 performs movements relative to the core 34 parallel to the optical axis 13 of the lens system, i.e. focussing movements. Furthermore, the dimensions of the air gaps have also been selected in such a way that tilting movements about the axis 30 are possible without the coil 19 coming into contact with parts of the permanent magnetic stator 25.

The two coils 21 and 22 are jointly mounted on a coil mount 37 which is manufactured from a non-magnetic material such as aluminium or plastic. Said mount consists of a sleeve 38 which fits around the tube 9 of the objective 8, which sleeve for each coil is provided with two radially directed coil bases 39 and 40 for the fixation of the coils. The assembly consisting of the coil mount 37 and the two coils 21 and 22 is combined to one unit with the aid of a suitable glue or impregnating lacquer, so that no vibrations can occur between the various components. The connection between this assembly and the tube 9 of the objective is also made by glueing, so that the tube together with the coil mount 37 and the coils 21 and 22 constitutes one solid unit.

FIG. 5 shows the unit 2 used in the read unit of FIG. 1 on an enlarged scale, said unit comprising a diode laser 41 and a combined scan and focussing wobbler 42. This wobbler is glued onto a disc 43 of an insulating material at whose edge a plurality of metal connecting pins 34 are provided for making electrical connections with the diode laser 41, and with two piezo-electric drive means in the form of two piezo-plates 45 and 46. FIG. 1 shows that the disc 43 is connected to the tube 9 of the objective 8 with the aid of a cylindrical sleeve 47.

The combined scan and focussing wobbler 42 comprises a metal resilient rod-shaped radiation source carrier in the form of a rod 48 with dimensions of substantially 0.4×0.7×3 mm. The radiation source, in the present example an aluminum-gallium-arsenide diode laser 41, is soldered onto the free end 49 of the rod 48. Thus, a satisfactorily heat-conducting fixation of the diode laser 41 onto the rod 48 is obtained. At some distance from the diode laser 41 the rod 48 is connected to a metal heat sink 50 with dimensions of substantially 4.5×5×3.5 mm. The thermal capacity and the surface area of the heat sink 50 are several times greater than those of the diode laser 41, so that the heat produced at the location of the diode laser can be carried off with a low temperature gradient to locations where it can be removed to the ambient air within the tube 9 over a sufficiently large surface area. If desired, the tube may be provided with vent holes. The two piezo-plates 45 and 46 are also soldered to the rod 48 and to the heat sink 50. They are disposed at an angle of 90° relative to each other, so that by the application of voltage to the piezo-electric plates the rod 48 can be deflected in a direction F of the optical axis 13 of the lens system and in a direction S transverse thereto, so as to obtain the focussing wobble and the scan wobble respectively.

The rod 48 is integral with the heat sink 50 manufactured from a solid block of brass by means of a spark-erosion operation. By the spark erosion operation two slots 51 and 52 are formed which separate the rod 48 from the remaining part of the component. As the rod 48 is integral with the component 50 excellent heat transfer from the rod to the other part of the component is guaranteed.

Figure 10:
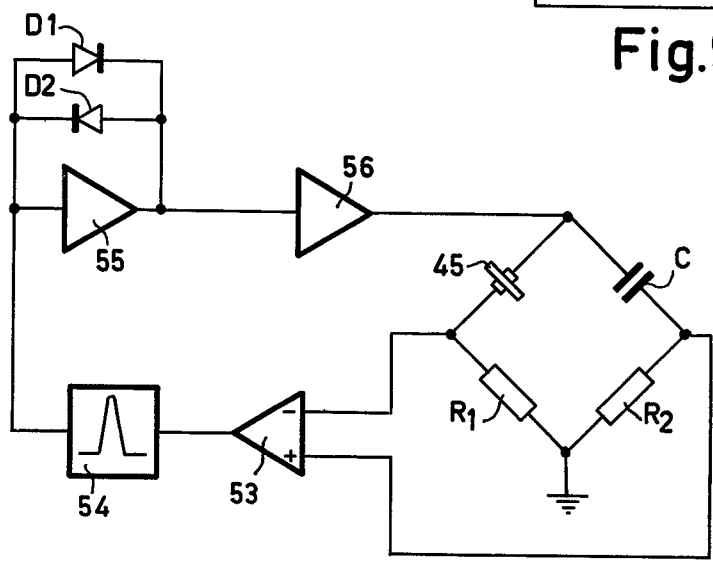
FIG. 10 shows a block diagram of an electrical power supply circuit for a scan or a focussing wobbler.

FIG. 10 shows a block diagram of an electrical power supply circuit for the piezo-plate 45. The plate together with the capacitor C and the two resistors R1 and R2 is included in a bridge. The difference voltage across the bridge is amplified by a differential amplifier 53. The amplified signal is applied to an amplifier 55 via a band-pass filter 54, across which amplifier two diodes D1 and D2 are connected in opposite sense, so that the assembly functions as a limiter. The output voltage is applied to the amplifier 56 whose output voltage in its turn is applied to the bridge and thus to the piezo-plate 45. The band-pass filter 54 is turned to the resonant frequency of the rod 48. The circuit serves to apply the difference voltage across the bridge to the piezo-plate in the correct phase and after limitation, so that the rod 48 is excited at its natural frequency. As the circuit is fully conventional it will not be described in any more detail. In this respect it may be mentioned that the active length of the piezo plates, which are made of PXE5, is 2 mm at a thickness of 0.25 mm and a width of 0.5 mm. The frequencies for the scan wobble and the focussing wobble are 25 and 50 kHz respectively. At a difference voltage varying between $-5$ and $+5V$, the travel of the diode laser between its extreme position is $0.1\mu$.

For a combined scan wobbler and focussing wobbler in accordance with FIG. 5, it is of importance that the piezo-plates 45 and 46 are mounted at the correct location. When they are mounted too closely near the fixed end of the rod 48, the amplitude of the diode laser 41 will become too small. However, if the location of mounting is selected near the free end of the rod 48 the amplitude also becomes smaller than necessary, owing to the inherent rigidity of the piezo-plates. The piezo-plates should be connected to the rod 48 at such a location between the free end and the fixed end that the ratio between the periodic movements of the diode laser 41 and the amplitude of the supply voltages applied to the piezo-electric plates is approximately a maximum, by utilizing the excursion of the rod 48 at resonance while the vibrating rod loads the piezo-plate in such a way that a maximum transfer of driving power is possible. The correct location is to be determined by experiment. It has been found that in an embodiment in accordance with FIG. 5 the piezo-plates 45 and 46 should be disposed slightly further in the direction of the fixed end of the rod 48 than in the direction of the free end.

Figure 6:
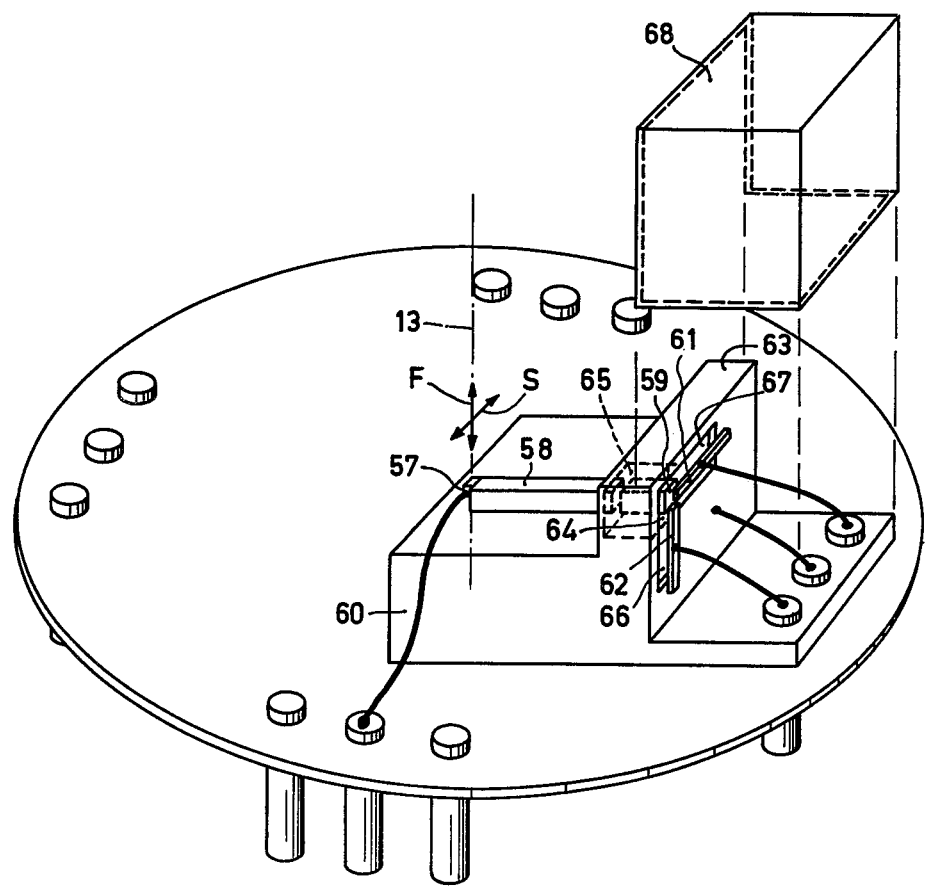
FIG. 6 shows a different example of a combined scan and focussing wobbler as well as a metal shield for electro-magnetically shielding the piezo-electric drive means.
Figure 8:
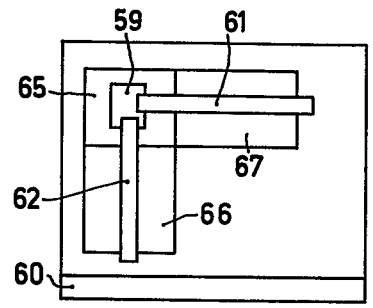
FIG. 8 is a rear view of the combined wobbler of FIG. 6 on a reduced scale.

FIG. 6 (also see FIG. 8) shows a different embodiment of a combined focussing and tracking wobbler. In this embodiment a semiconductor diode laser 57 is mounted on a free end of a rod 58. This rod has a second free end, designated 59, which is situated opposite the diode laser 57. Between these two free ends the rod is rigidly connected to a heat sink 60. Two piezo-electric drive means 61 and 62, again so-called piezo-plates, are connected to the free end 59 of the rod 58 by soldering. In this embodiment the rod 58 and the heat sink 60 are also integrally manufactured from a suitable material, for example brass. By means of a spark erosion process a recess 64 is formed in the flange 63, which recess has a depth which is smaller than the thickness of the flange 63, so that a wall portion 65 is left, which constitutes the connection between the rod 58 and the heat sink 60. The two piezo-plates 61 and 62 extend over two slots 66 and 67 which are also formed by spark erosion. At their ends opposite the end 59 of the rod 58 the two piezo-plates are soldered to the heat sink 60. The two piezo-electric plates are perpendicular to each other and are energized independently of each other. The forces which are exerted on the free end 59 of the rod 58 by the two piezo-plates 61 and 62 deform the wall portion 65 and the rod 58, by means of which the displacements of the diode laser 57 are obtained. The two piezo-plates 61 and 62 are connected in such a frequency that a maximum amplitude is obtained at the location of the diode laser 57, in that the rod 58 resonates in the relevant direction of movement at its natural frequency. For electro-magnetic shielding of the piezo-plates there is provided a shield 68 which is made of a suitable material, such as for example mu-metal.

Figure 7:
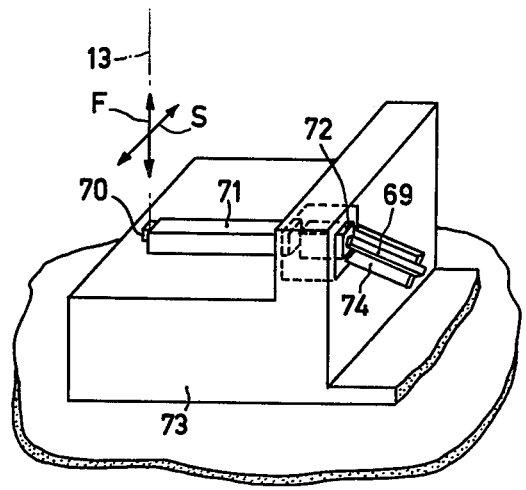
FIG. 7 shows an example of a combined scan and focussing wobbler similar to that of FIG. 6, but comprising only one piezo-electric drive element.
Figure 9:
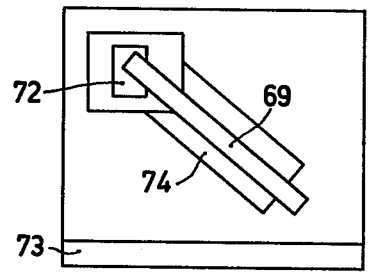
FIG. 9 is a rear view on a reduced scale of the combined wobbler of FIG. 7.

FIG. 7 (also see FIG. 9) shows a modified combined focussing and tracking wobbler, employing a single piezo-plate 69 instead of two piezo-plates 61 and 62. A diode laser 70 is mounted on a rod 71 with a free end 72, disposed opposite the diode laser 70, to which end the piezo-plate 69 is connected by soldering. The piezo-plate 69 extends over a slot 74 formed by spark erosion and is connected to the heat sink 73 by its end which is disposed opposite the end 72 of the rod 71. Owing to its oblique orientation the piezo-plate 69 exerts forces on the rod 71 in a direction between the directions S and F of the laser 70 for the scan wobble and the focus wobble. Thus, two vibrations can be imparted to the diode laser 70 using a single piezo-plate only.

What is claimed is:

1. An optical read unit for optionally reading radiation-reflecting information tracks disposed in an information plane of an information carrier, which moves relative to the read unit, of the type wherein a radiation beam is focussed to a read spot in a focussing plane, which read unit comprises a low-mass radiation source for producing the radiation beam, a lens system for focussing the radiation beam to a read spot in the focussing plane, optical and electronic means for receiving a radiation beam which has been reflected by the information tracks and modulated by the information in the information track and comprising a radiation-sensitive electronic detector for the conversion of the radiation-beam modulation into an electrical modulation, a scan wobbler for an automatic tracking system and comprising electromechanical drive means for periodically moving the radiation source so as to cause the read spot in the focussing plane to move periodically about a global position with low amplitude in a direction transverse to the information track being read, a focussing wobbler for an automatic focussing system and comprising electromechanical drive means for periodically moving the radiation source so as to cause the focussing plane to move periodically about a global position with low amplitude in a direction normal to the information plane at the location of the read spot, and an electrical power supply circuit for supplying a supply voltage to the electromechanical drive means, the improvement wherein at least one of the wobblers comprises:

a metal resilient rod-shaped radiation source carrier with an end to which the radiation source is secured in a satisfactory heat-conducting manner, a metal heat sink whose thermal capacity and surface area are several times greater than those of the radiation source and to which the radiation source carrier is connected in a satisfactory heat-conducting manner at some distance from the radiation source so as to carry off heat produced at the location of the radiation source with a low temperature gradient to locations where it can be released to the environment over a sufficiently large surface area, and piezo-electric drive means rigidly connected to the said radiation source carrier and to parts of the read unit which are stationary relative thereto.

2. An optical read unit as claimed in claim 1, wherein the resilient rod-shaped radiation source carrier is integral with a metal mount and consists of a portion of the mount which is separated from the remaining portion by means of at least one slot.

3. An optical read unit as claimed in claim 1, and provided with both a scan wobbler and a focussing wobbler, wherein the piezo-electric drive means comprise drive means for the scan wobble disposed in a first direction and drive means for the focusing wobble disposed in a second direction perpendicular to the first direction.

4. An optical read unit as claimed in claim 1, wherein for each wobbler the electrical power supply circuit for the piezo-electric drive means comprises a self-oscillating loop which includes the piezo-electric drive means for periodically moving the radiation source with a frequency corresponding to the resonant frequency of the resilient rod-shaped radiation source carrier in the relevant direction of movement.

5. An optical read unit as claimed in claim 1, wherein the metal resilient rod-shaped radiation source carrier consists of a rod spring with a free end disposed opposite thereto, a fixed end of the radiation source being secured to the free end and the fixed end being connected to the heat sink, and where the piezo-electric drive means is connected to the rod-spring at such a location between the free end and the fixed end, that the ratio between the amplitude of the power supply voltage applied to the piezo-electric drive means substantially has a maximum value.

6. An optical read unit as claimed in claim 1, wherein the metal resilient rod-shaped radiation-source carrier consists of a rod spring having a first free end on which the radiation source is mounted and a second free end disposed opposite the first end, wherein between the two free ends the radiation source carrier is rigidly connected to the heat sink at a connection point, and that the piezo-electric drive means are connected to the rod spring near the second free end.

7. An optical read unit as claimed in claim 6, wherein the piezo-electric drive means of the scan wobbler and the drive means of the focussing wobbler are combined to a single drive means which exerts driving forces on the radiation source carrier in a direction which is disposed between the directions of the radiation source movements necessary for the scan wobble and the focussing wobble respectively.

8. An optical read unit for optically reading radiation-reflecting information tracks disposed in an information plane of an information carrier, which moves relative to the read unit, of the type wherein a radiation beam is focussed to a read spot in a focusing plane, which read unit comprises:

a low-mass radiation source for producing the radiation beam, a lens system for focussing the radiation beam to a read spot in the focussing plane, optical and electronic means for receiving a radiation beam which reflected by the information tracks and modulated by the information in an information track and comprising a radiation-sensitive electronic detector for the conversion of the radiation-beam modulation into an electrical modulation, a scan wobbler for an automatic tracking system and comprising electromechanical drive means for periodically moving the radiation source so as to cause the read spot in the focussing plane to move periodically about a global position with low amplitude in a direction transverse to the information track being read, an electrica power supply circuit for supplying a supply voltage to the electromechanical drive means, the improvement wherein said scan wobbler comprises:

a metal resilient rod-shaped radiation source carrier with an end to which the radiation source is secured in a satisfactory heat-conducting manner, a metal heat sink whose thermal capacity and surface area are several times greater than those of the radiation source and to which the radiation source carrier is connected in a satisfactory heat-conducting manner at some distance from the radiation source so as to carry off heat produced at the location of the radiation source with a low temperature gradient to locations where it can be released to the environment over a sufficiently large surface area, and piezo-electric drive means rigidly connected to said radiation source carrier and to parts of the read unit which are stationary relative thereto.

9. An optical read unit for optically reading radiation-reflecting information tracks disposed in an information plane of an information carrier, which moves relative to the read unit, of the type wherein a radiation beam is focussed to a read spot in a focussing plane, which read unit comprises:

a low-mass radiation source for producing the radiation beam, a lens system for focussing the radiation beam to a read spot in the focussing plane, optical and electical means for receiving a radiation beam which has been reflected by the information tracks and modulated by the information in an information track and comprising a radiation-sensitive electronic detector for the conversion of the radiation-beam modulation into an electrical modulation, a focussing wobbler for an automatic focussing system and comprising electromechanical drive means for periodically moving the radiation source so as to cause the focussing plane to move periodically about a global position with low amplitude in a direction normal to the information plane at the location of the read spot, and an electrical power supply circuit for supplying a supply voltage to the electromechanical drive means, the improvement wherein the focussing wobbler comprises:

a metal resilient rod-shaped radiation source carrier with an end to which the radiation source is secured in a satisfactory heat-conducting manner, a metal heat sink whose thermal capacity and surface area are several times greater than those of the radiation source and to which the radiation source carrier is connected in a satisfactory heat conducting manner at some distance from the radiation source so as to carry heat produced at the location of the radiation source with a low temperature gradient to locations where it can be released to the environment over a sufficiently large surface area, and the piezo-electric drive means rigidly connected to said radiation source carrier and to parts of the read unit which are stationary relative thereto.

* * * * *